(12) United States Patent
Kuttner

(10) Patent No.: US 6,707,405 B2
(45) Date of Patent: Mar. 16, 2004

(54) INTEGRATED ANALOG MULTIPLEXER

(75) Inventor: Franz Kuttner, St. Magdalen (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/280,162

(22) Filed: Oct. 25, 2002

(65) Prior Publication Data

US 2003/0080800 A1 May 1, 2003

(30) Foreign Application Priority Data

Oct. 26, 2001 (DE) .......................... 101 52 888

(51) Int. Cl.$^7$ ................................ H03M 1/00
(52) U.S. Cl. ................ 341/141; 341/155; 341/143
(58) Field of Search ................... 341/141, 143, 341/155, 118, 120; 327/408

(56) References Cited

U.S. PATENT DOCUMENTS

| | | | | |
|---|---|---|---|---|
| 3,968,487 A | * | 7/1976 | Herring et al. | 341/141 |
| 5,392,043 A | * | 2/1995 | Ribner | 341/143 |
| 5,606,320 A | * | 2/1997 | Kleks | 341/161 |
| 5,691,720 A | * | 11/1997 | Wang et al. | 341/143 |
| 5,955,919 A | | 9/1999 | Lübbe et al. | |
| 6,323,801 B1 | * | 11/2001 | McCartney et al. | 341/172 |
| 6,570,519 B1 | * | 5/2003 | Yang | 341/143 |
| 2003/0034908 A1 | * | 2/2003 | Nestler et al. | 341/141 |

OTHER PUBLICATIONS

Tietze, U., Schenk, C., *Hableiter–Schaltungstechnik, 11.* Auflage, Berlin, ISBN 3–540–64192–0 (pp. 1005, 1006, 1017–1018).

* cited by examiner

Primary Examiner—Michael Tokar
Assistant Examiner—Linh Van Nguyen
(74) Attorney, Agent, or Firm—Patterson, Thuente, Skaar & Christensen, P.A.

(57) ABSTRACT

An integrated analog multiplexer with several multiplexer inputs, a multiplexer output, a switch device and a differential amplifier with an inverting and a non-inverting amplifier input as well as an amplifier output, wherein the amplifier output forms the multiplexer output, the differential amplifier is connected as inverting amplifier by means of a feedback branch from the amplifier output to the inverting amplifier input and the switch device selectively connects one of the multiplexer inputs with the inverting amplifier input.

15 Claims, 2 Drawing Sheets

INTEGRATED ANALOG MULTIPLEXER

FIELD OF THE INVENTION

The invention concerns an integrated analog multiplexer with several multiplexer inputs, a multiplexer output, a switch device and a differential amplifier with an inverting and a non-inverting amplifier input as well as an amplifier output.

Such integrated analog multiplexers are used in the analog signal processing to selectively connect analog signals from different sources to a node. For that, complementary CMOS-transistor pairs that are powered by operational amplifiers are often used as a switch.

BACKGROUND

In modern technologies that are especially geared for digital performance, such integrated analog multiplexer do not function that good any more. For one, the reduced supply voltage (for example 1.2 Volt in 0.13 μm processes), the scarcely reduced input voltage of the transistors and the larger substrate control effect lead to the result, that the forward resistances of the transistors becomes higher and the variation of the forward resistances increases in dependence of the voltage of the analog signals, so that undesired harmonic distortions occur during the through connect of the analog signals.

An attempt to prevent the variation of the forward resistance is, for example, to maintain the gate-source voltage constant with a boost-switch through which, at a voltage of the analog signal near the supply voltage, the gate voltage can increase over the supply voltage by approximately the input voltage. If now a discharged capacitor is to be charged over the drain port of the switching transistor, the gate-drain voltage is higher, especially at the beginning of the loading process, than the maximum allowed gate voltage, so that the gate oxide of the switching transistor will be overstressed, which reduces the life time of the switching transistor and therefore of the analog multiplexer as well.

Furthermore, at a supply voltage of 1.2 Volt, the operational amplifiers can only address the area between 0.2 Volt and 0.9 Volt for the analog signal. But especially in this area the switching transistors don't conduct very well. With complementary CMOS-transistor pairs the N-channel transistor and the P-channel transistor as well conduct particularly bad, especially at half of the supply voltage (meaning 0.6 Volt).

SUMMARY

It is the task of the invention on hand to further develop an integrated analog multiplexer of the kind previously mentioned in such a way that it is particularly well suited for low supply voltages.

According to the invention the task is solved with an integrated analog multiplexer of the previously mentioned kind in such a way that the amplifier output of the differential amplifier forms the multiplexer output, than the differential amplifier, by means of a feedback branch, is switched from the amplifier output to the inverting amplifier input as inverted amplifier and than the switch device selectively connects one of the multiplexer inputs with the inverting amplifier input.

The result is that at the multiplexer according to invention one of the analog signals that is applied to the individual multiplex inputs is switched to the inverting amplifier input (and therefore selected) in the first place and the selected signal is amplified after that. Therefore, only one differential amplifier is needed regardless of the number of multiplexer inputs, which means that the analog multiplexer can be designed in a very compact way. It is also very advantageous to first select the analog signal and to amplify it afterwards, because by this the possibly existing bad conductivity in the switch device, if it contains field effect transistor as switch elements for example, is compensated by the post-connected differential amplifier. Therefore, an integrated analog multiplexer is provided, which shows high-impedance inputs and a low-impedance output even at low supply voltages (of 1.2 Volt for example), so that even capacitive loads can be driven easily.

In particular, the switch device for each of the multiplexer inputs at the multiplexer according to invention can have a first field effect transistor of a first polarity, and it is preferred that one of the field effect transistors is closed or activated with a boosted control voltage. A boosted control voltage is a voltage that is elevated higher than a predetermined reference voltage by a so called boost-switch. Here, the boosted control voltage is preferably higher than the supply voltage of the integrated analog multiplexer. Since all first field effect transistors have the same polarity, the multiplexer according to invention can be produced especially easy and compact integrated.

The addressing of the switch device for the selective connection of one of the multiplexer inputs with the inverting amplifier input can be easily realized as well, because a sole transistor is intended for each of the multiplexer inputs and the conductivity of the activated transistors is improved because of the boosted (increased) control voltage.

Furthermore, the feedback branch can contain a second, activated field effect transistor of the first polarity, which is preferably addressed with the boosted control voltage. With the intention of a second transistor it is particularly easy to realize the same resistances in the feedback branch and in the multiplexer input channel of the multiplexer input that is connected with the inverting amplifier input, if the first and the second transistor are designed the same way.

It is preferred to use MOS-transistors as field effect transistors, since those can easily be miniaturized and are suited for small supply voltages.

Also, the switch device as well as the feedback branch can only contain field effect transistors of one polarity, so that the production of the multiplexer according to invention is simplified.

A further development of the multiplexer according to invention is that the field effect transistors are directly (without interconnection of resistors) connected with the inverting amplifier input. With that, the voltages on the source and drain ports of the transistors scarcely depend on the analog signals, so that the field effect transistors change the analog signals only slightly.

In a particularly preferred version the value of the voltage gain of the differential amplifier is one. With that, the analog multiplexer acts as a buffer, which does not change the size of the activated analog signal, except for the sign, and which has a large input impedance and an extreme small output impedance for the analog signals.

In particular at the multiplexer according to invention the non-inverting amplifier input can be set on a constant reference potential. By this, the input impedance of the analog multiplexer is essentially determined by the resistance of the multiplexer input channel through which the analog signal is connected to the inverting amplifier input.

In an advantageous advancement of the multiplexer according to invention, the switch device connects each of the multiplexer inputs that is not connected with the inverting amplifier input with a voltage source, whose potential corresponds with the potential on the inverting amplifier input. If the non-inverting amplifier input is set on the reference potential, the potential of the voltage source therefore corresponds with the reference potential, since the potential at the inverting input corresponds with the reference potential with each increase. With that, a feedback is avoided during the switching in the analog multiplexer to the sources of the analog signals, since the same potential applies all the time regardless of the condition of the switch device.

Furthermore, the differential amplifier can be supplied with a first and a second operating potential, by which the reference potential lays between the two operating potentials, preferably in the middle. With this selection of the reference potential the largest possible dynamic range of the differential amplifier can be utilized.

A particularly preferred advancement of the multiplexer according to invention is its differential design, in which the differential amplifier has a differential output with an inverting and a non-inverting amplifier output, whereby the feedback branch connects the non-inverting amplifier output with the inverting amplifier input and another feedback branch connects the inverting amplifier output with the non-inverting amplifier input and whereby each multiplexer input has a first and a second input port for a differential input signal and the switch device selectively connects the first input port of a first (selected) of the multiplexer inputs with the inverting amplifier input and the second input port of the first multiplexer input with the non-inverting amplifier input, as well as the at remaining multiplexer inputs the two input ports with each other.

It is therefore not necessary at the differential variation to place a reference potential on the non-inverting amplifier input and as a result the analog multiplexer can be designed easier and smaller. Additionally, fluctuations of the supply voltage can be better compensated due to the differential design, and the dynamic area of the difference amplifier, and therefore of the multiplexer according to invention can be doubled by the same supply voltage in comparison to the non-differential variation.

In the differential variation in particular the switch device (only) can contain field effect transistors of a polarity for switching. This eases the production of the multiplexer according to invention.

Furthermore, the switched-on field effect transistors can be addressed with a boosted control voltage, so that the analog signals can be well gated.

Furthermore, it is preferred to connect the field effect transistors directly (without interconnection of resistors) with the amplifier inputs. By that, the voltages on the source- and drain ports of the field effect transistors scarcely depend on the analog signals, by which reliability problems do not arise for the boosted transistors that are described in the description manual.

Additionally the differential amplifier at the multiplexer according to invention can be designed as an operational amplifier. By this the known advantages of an operational amplifier can be used at the analog multiplexer according to invention. Likewise, for example, the common mode rejection of the operational amplifier is extremely high and with the allocation of the operational amplifier as the inverting amplifier the output impedance is extremely small, while the input impedance is very high.

DETAILED DESCRIPTION OF DRAWINGS

In the following the principle of the invention is explained in more detail with the help of drawings: They show:

DETAILED DESCRIPTION

Figure 1:
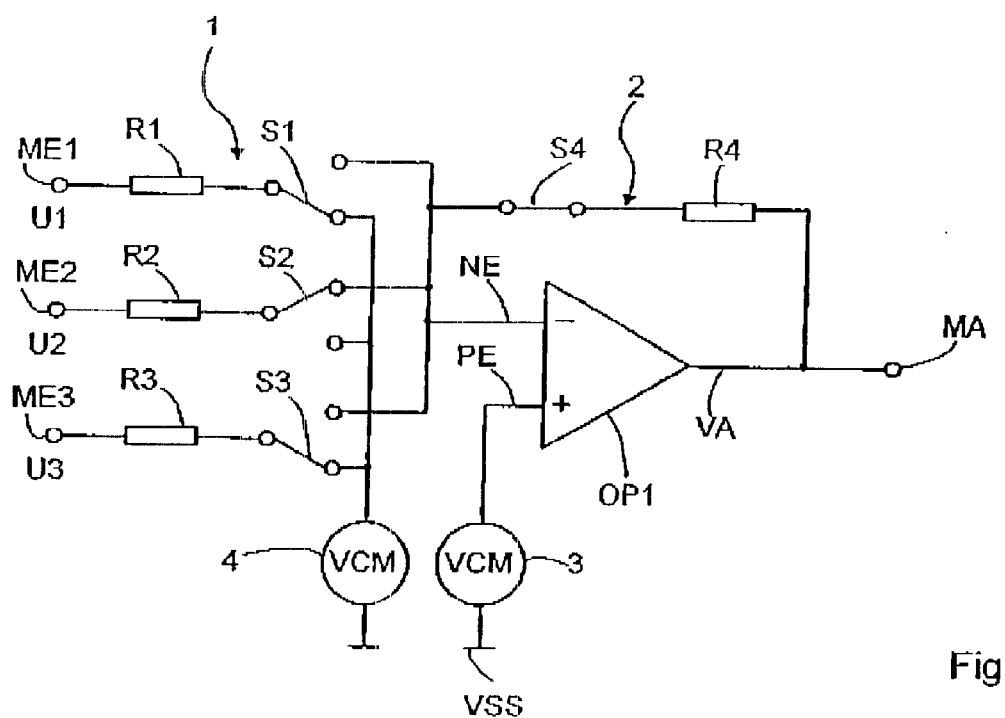
FIG. 1 is a schematic diagram of the integrated analog multiplexer according to invention.

The integrated, analog multiplexer according to invention has in a first, shown in FIG. 1, variation three multiplexer inputs ME1, ME2 and ME3, a multiplexer output MA, a switch device 1 and an operational amplifier OP 1 as differential amplifier with an inverting and a non-inverting amplifier input NE, PE, as well as an amplifier output VA which forms the multiplexer output MA.

A feedback branch 2 connects the amplifier output VA with the inverting amplifier input NE, and the non-inverting amplifier input PE is connected with a voltage source 3, which applies a constant common mode voltage VCM on the non-inverting amplifier input PE. The operational amplifier OP1 is therefore connected as inverting amplifier.

Each of the multiplexer inputs ME1 to ME3 is connected with a first switch S1, S2, S3 through a first resistor R1, R2, R3 (which all could have the same resistance), by which each first switch S1 to S3 can be switched back and forth between a first and a second switch position. In the first switch position, which is drawn for the first switch S2 of the second multiplexer ME2, a connection is established to the inverting amplifier input NE, while in the second switch position, in which the switches S1 and S3 are, a connection is established to a second voltage source 4, which yields the common mode voltage VCM.

The switch device 1 is thereby designed or addressed in such a way, that always only one of the first switch S2 is set in the first switch position and that the remaining first switches S1, S3 are in the second switch position. Therefore only one of the multiplexer inputs ME1 to ME3 is connected at one time with the inverting amplifier inputs NE. Analog signals U1, U2 and U3, of which one can selectively be transferred to the multiplexer MA, can be applied to the multiplexer inputs ME1 to ME3.

A second resistor R4 and a second switch S4, which is closed, are intended in the feedback branch 2. The relation of the resistance value of the second resistor R4 to the forward resistance value of the second switch S4 should correspond with the relation of the resistance value of the first resistor R1 to R3 to the forward resistance value of the switches S1 to S3. That can be achieved by scaling the width of the MOS transistors of the switches. In a design as buffer (amplification=−1) all resistance values of the resistors 1 to 4 are equal, and all MOS transistors have to be dimensioned equally. If, for example, two is selected for amplification, the resistance value of the resistor R4 must be selected twice as high as the resistance value of the resistors R1 to R3. Accordingly, the width of the MOS-transistor of the switch S4 is to be selected half the size as the width of the transistors of the switches S1 to S3. With that it is achieved, that the forward resistance of the switch S4 as well becomes twice as high as the forward resistance of the switches S1 to S3, by which the amplification is set exactly to 2.

If the analog multiplexer shown here is set up for a supply voltage of 1.2 Volt and the operational amplifier OP1 is supplied with operating voltages VDD, VSS (1.2 Volt, 0 Volt) and can regulate the area from 0.2 through 0.88 Volt, the analog signals U1, U2, U3 can be switched from 0.2 through 0.88 Volt and a value of 0.6 Volt is preferably selected as common mode voltage VCM.

Figure 2:
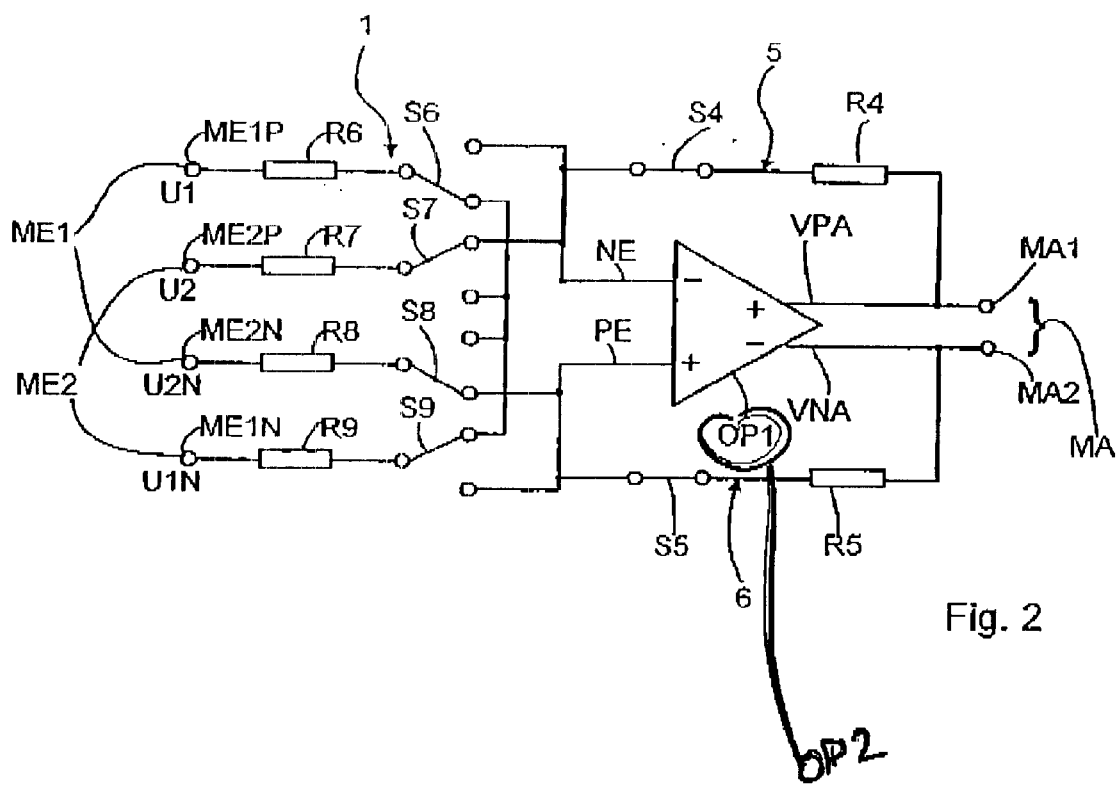
FIG. 2 is a schematic diagram of another integrated analog multiplexer according to invention.

FIG. 2 is a differential variation of the analog multiplexer illustrated in FIG. 1 but for better clarity only two (differential) multiplexer inputs ME1 and ME2 are drawn in.

Each of the differential multiplexer inputs ME1 and ME2 shows a first input port ME1P, ME2P and a second input port ME1N and ME2N. The differential, analog signals U1, U1N; U2, U2P are applied to each of the two input ports ME1P, ME1N; ME2P, ME2N, whereby a differential input signal shows two signal components that are inverted to each other relative to their common mode potential. If, for example, the differential input signal shows a sinusoidal voltage curve the two signal components are phase-shifted to each other by 180°.

The analog multiplexer shown in FIG. 2 shows as the differential amplifier an operational amplifier OP2 with an inverting and a non-inverting amplifier input NE, PE as well as an inverting and a non-inverting amplifier output VNA, VPA, whereby the two amplifier outputs VNA, VPA form a differential multiplexer output with a first and a second output port MA1, MA2. The non-inverting amplifier output VPA is connected with the inverting amplifier input NE through a feedback branch 5, which corresponds with the feedback branch 2 of FIG. 1, and the inverting amplifier output VNA is connected with the non-inverting amplifier input PE through a second feedback branch 6. The second feedback branch 6 contains a resistor R5 and a switch S5 which are identical with the resistor R4 and the switch S4 of the first feedback branch 5.

A resistor R6, R7, R8 and R9 and a switch S6, S7, S8, S9 are intended between each of the input ports ME1P, ME1N; ME2P, ME2N and the operational amplifier OP2, which can be set in a way that the first input port ME2P of the selected multiplexer input ME2 is connected with the inverting amplifier input NE and the second input port ME2N of the selected multiplexer input ME2 with the non-inverting amplifier input PE. The two input ports ME1P and ME1N of the non-elected multiplexer input ME1 are not connected with the amplifier inputs NE, PE, but with each other.

At the design as buffer (amplification=1) the resistance values of the resistors R6, R7, R8 and R9 correspond with the resistance value of the resistor R4 and the resistor R5 and the switches S6, S9 are the same as the switches S4, S5 of the feedback branches 5,6. The differential voltage amplification is therefore −1.

Figure 3:
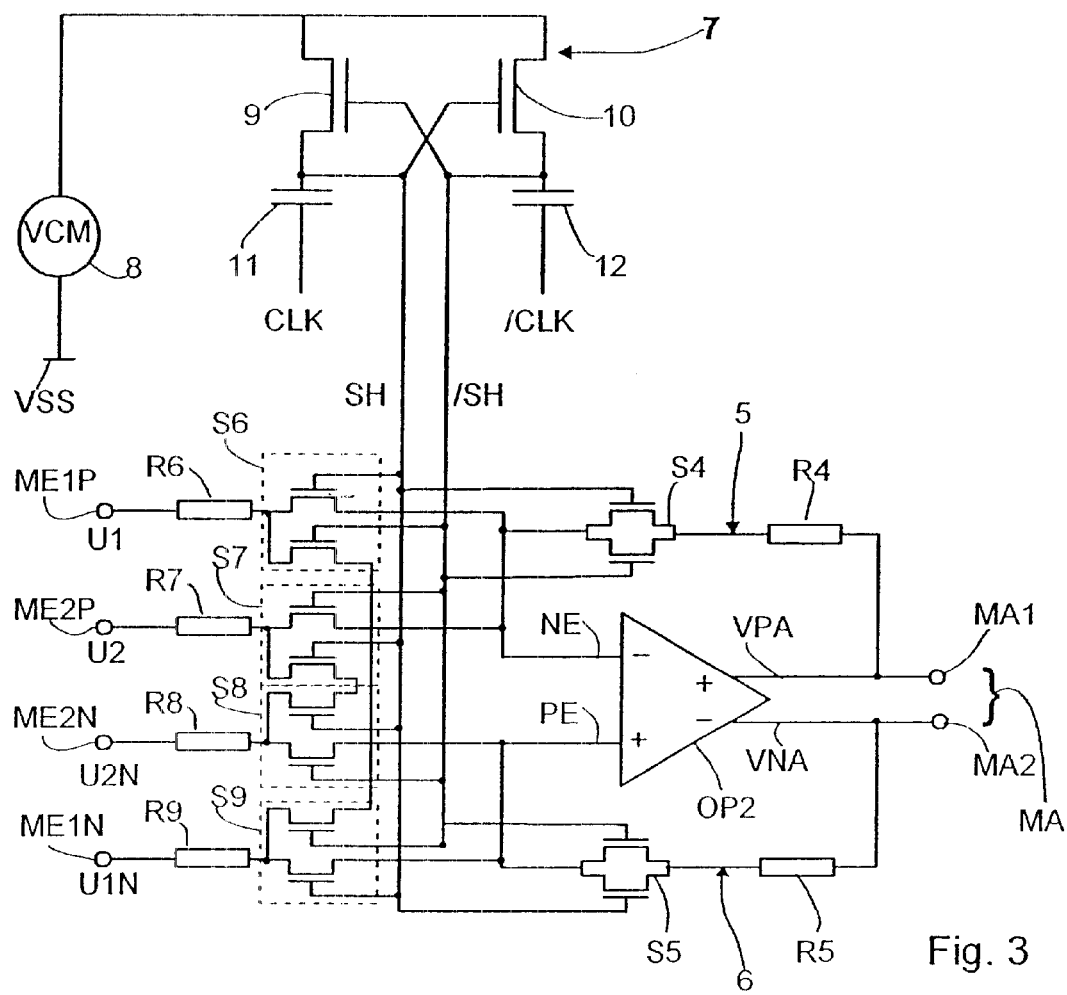
FIG. 3 is another diagram of the analog multiplexer of FIG. 2.

FIG. 3 shows a detailed diagram of the variation illustrated in FIG. 2, whereby the switches S4 to S9 are realized through N-channel MOS transistors and a control voltage generating unit 7 is illustrated additionally.

As it can be concluded from FIG. 3, each switch S4 to S9 is formed by two N-channel MOS transistors and its gate ports are addressed by control signals SH and /SH generated from the control unit 7. Therefore, one of the N-channel MOS-transistors that form the switches S6 to S9 is always turned on and the other one is turned off, so that the output end of the respective resistor R6 to R9 is either connected with the respective amplifier input NE, PE or with the respective N-channel MOS-resistor of the respective input port.

The two switches S4 and S5 in the two feedback branches 5 and 6 as well are each formed by two N-channel MOS-transistors, of which one is always turned on and the other one turned off, so that the desired equality of the resistance in the feedback branches 5 and 6 and the multiplexer input channels is achieved.

The control signal generating unit 7 shows a voltage source 8 that generates a common mode voltage VCM. Furthermore, the control signal generating unit 7 contains a first and a second N-channel MOS-transistor 9, 10, which source ports are connected with each other and a port of the voltage source 7. A boost capacitor 11, 12, which has a clock signal CLK, /CLK respectively, applied to its other port side, is connected to each of the drain ports of the N-channel MOS-transistors 9 and 10. The drain port of the first transistor 9 is connected with the gate port of the second transistor 10, and the drain port of the second transistor 10 is connected with the gate port of the first transistor 9, whereby the control signals SH and /SH apply on each of the drain ports (as can be seen in FIG. 3).

Figure 4:
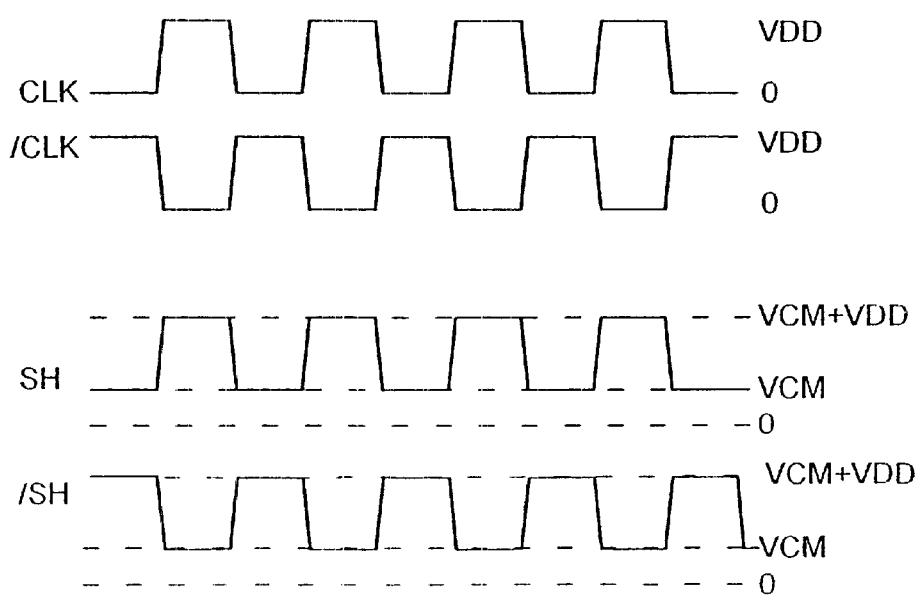
FIG. 4 is an illustration to explain the generation of the control voltage for the switches.

FIG. 4 illustrates the voltage curve of the clock signals CLK and /CLK and also the resulting voltage curve of the control signals SH and /SH. As it can be concluded from FIG. 4, the control signals SH and /SH are boosted, so that the switch-on voltage of the N-channel MOS-transistors is VCM+VDD and the switch-off voltage is VCM. At supply voltages VOD of 1.2 Volt and VSS of 0 Volt, a common mode voltage VCM of 0.6 Volt the control voltages SH,/SH are therefore switched back and forth between 0.6 Volt (transistor turned off) and 1.6 Volt (transistor turned on).

By this design the voltage at the source and drain ports of the N-channel MOS transistors scarcely depends on the applied analog signals and is VCM if the common mode voltage of the analog signals U1, U1N; U2, U2N is VCM so that no undesired high stress of the gate oxide occurs.

In the described variation example the transistors are from N-channel-line type. Naturally P-channel transistors can be used instead as well. Also, the switches can each be designed by field effect transistors of different polarity.

Furthermore, the switches S1 to S4, shown in FIG. 1, can be realized in the same way as the switches in the differential variation of the analog multiplexer, whereby the addressing of the transistors can also be done with a boosted control voltage. This can especially be generated in a way that in the switched-on condition the voltage between the gate port and the source port, on which the analog signal lays that is to be switched, is held constant by an interconnecting capacitor.

The integrated analog multiplexer can be realized in NMOS-, PMOS- or CMOS technology. It is furthermore possible to apply the SOI-technology (silicon or insulator).

We claim:

1. An integrated analog multiplexer comprising a plurality of multiplexer inputs, a multiplexer output, a switch device and a differential amplifier with an inverting and a non-inverting amplifier input as well as an amplifier output, wherein the amplifier output forms the multiplexer output, the differential amplifier by means of a feedback branch from the amplifier output to the inverting amplifier input is wired as inverting amplifier and the switch device selectively connects one of the multiplexer inputs with the inverting amplifier input, wherein the switch device for each of the multiplexer inputs has a first field effect transistor of a first polarity that is preferably switched-on with a boosted control voltage, and wherein the feedback branch includes a second, switched-on field effect transistor of the first polarity that is preferably addressed with the boosted control voltage.

2. The analog multiplexer according to claim 1, wherein the field effect transistors are directly connected with the inverting amplifier input.

3. The analog multiplexer according to claim 2, wherein the differential amplifier is an operational amplifier.

4. The analog multiplexer according to claim 1, wherein the value of the voltage gain of the differential amplifier is one and the multiplexer is thereby adapted to act as a buffer without changing the size of the activated analog signal.

5. The analog multiplexer according to claim 4, wherein the differential amplifier is an operational amplifier.

6. The analog multiplexer according to claim 1, wherein the non-inverting amplifier input is set on a constant reference potential.

7. The analog multiplexer according to claim 6, wherein the switch device connects each of the multiplexer inputs that is not connected with the inverting amplifier input with a voltage source, whose potential corresponds with the potential on the inverting amplifier input.

8. The analog multiplexer according to claim 7, wherein the differential amplifier is supplied with a first and a second operating potential whereby the reference potential lays between the two operating potentials.

9. The analog multiplexer according to claim 8, wherein the differential amplifier is an operational amplifier.

10. The analog multiplexer according to claim 7, wherein the differential amplifier is an operational amplifier.

11. The analog multiplexer according to claim 6, wherein the differential amplifier is an operational amplifier.

12. The analog multiplexer according to claim 1, wherein the differential amplifier is an operational amplifier.

13. An integrated analog multiplexer comprising a plurality of multiplexer inputs, a multiplexer output, a switch device and a differential amplifier with an inverting and a non-inverting amplifier input as well as an amplifier output, wherein the amplifier output forms the multiplexer output, the differential amplifier by means of a feedback branch from the amplifier output to the inverting amplifier input is wired as inverting amplifier and the switch device selectively connects one of the multiplexer inputs with the inverting amplifier input, wherein the differential amplifier has a differential output with an inverting and a non-inverting amplifier output, whereby the feedback branch connects the non-inverting amplifier output with the inverting amplifier input and another feedback branch connects the inverting amplifier output with the inverting amplifier input, whereby multiplexer input has a first and a second input port for a differential input signal and that the switch device connects the first input port of a selected multiplexer input with the inverting amplifier input as well as the second input port of the selected multiplexer input with the non-inverting amplifier input and at the remaining multiplexer inputs the two input ports with each other;

wherein the switch device includes field effect transistors of a polarity, whereby the switched-on field effect transistors are addressed with a control voltage which preferably is boosted.

14. The analog multiplexer according to claim 9, wherein the field effect transistors are directly connected with the amplifier inputs.

15. The analog multiplexer according to claim 13, wherein the differential amplifier is an operational amplifier.

* * * * *